United States Patent [19]
Johnson et al.

[11] Patent Number: 5,472,650
[45] Date of Patent: Dec. 5, 1995

[54] METHOD OF MAKING CHEMICAL VAPOR INFILTRATED COMPOSITES

[75] Inventors: D. Lynn Johnson; Hamlin M. Jennings, both of Wilmette; Mark S. Spotz, Chicago; Daniel J. Skamser, Northbrook, all of Ill.

[73] Assignee: Northwestern University, Evanston, Ill.

[21] Appl. No.: 3,238

[22] Filed: Jan. 11, 1993

[51] Int. Cl.⁶ .................................................. H05B 6/64
[52] U.S. Cl. .......................... 264/432; 264/81; 427/543
[58] Field of Search ............................ 264/25, 26, 81; 427/249, 255, 543, 553, 585, 595

[56] References Cited

U.S. PATENT DOCUMENTS

| | | | |
|---|---|---|---|
| 3,160,517 | 12/1964 | Jenkin | 117/93.3 |
| 4,107,352 | 8/1978 | Hakim | 427/50 |
| 4,580,523 | 4/1986 | Sunaga et al. | 118/503 |
| 4,580,524 | 4/1986 | Lackey, Jr. et al. | 118/725 |
| 5,072,087 | 12/1991 | Apte et al. | 264/26 |
| 5,141,775 | 8/1992 | Patrigeon et al. | 264/81 |
| 5,238,710 | 8/1993 | Ahmad et al. | 427/553 |
| 5,254,374 | 10/1993 | Devlin et al. | 427/553 |

OTHER PUBLICATIONS

Development of a New, Faster Process for the Fabrication of Ceramic Fiber–Reinforced Ceramic Composites by Chemical Vapor Infiltration; Ceram. Eng. Sci. Proc., 6[7–8] 694–705 (1985).
Carbon–Carbon, An Overview; Ceram. Bull., vol. 67, No. 2, 1988 364–368; Buckley.
A Mathematical Model for Chemical Vapor Infiltration with Microwave Heating and External Cooling; J. Mater. Res., vol. 6, No. 4, Apr. 1991, 810–818; Gupta and Evans.
Deposition of Pyrolytic Carbon in Porous Solids; Chemistry and Physics of Carbon; vol. 9 (1973); 174–263; Kotlensky.
Advanced Ceramics by Chemical Vapor Deposition Techniques; Ceram. Bull., vol. 67, No. 2, 1988; 350–355; Stinton, Besmann and Lowden.
Vapor–Phase Fabrication and Properties of Continuous–Filament Ceramic Composites; Science, vol. 253, Sep. 6, 1991; 1104–1109; Besmann, Sheldon, Lowden and Stinton.
Chemical Vapor Deposited SiC Matrix Composites; J. Am. Ceram. Soc., 72[3] 478–480 (1989); Veltri, Condit and Galasso.
Chemical–Vapor–Infiltrated Silicon Nitride, Boron Nitride, and Silicon Carbide Matrix Composites; J. Am. Ceram. Soc., 73[7] 2137–2140 (1990); Veltri and Galasso.
The Effects of Reaction Parameters on the Deposition Characteristics in $Al_2O_3$ CVD; J. Vac. Sci. Technol. A 1(4), Oct.–Dec. 1983; 1820–1824 Park, Kim and Chun.
Alumina Fiber/Alumina Matrix Composites Prepared by a Chemical Vapor Infiltration Technique; Adv. Ceram. Mat., vol. 1, No. 2, 1986; 185–191; Colmet, Lhermitte–Sebire and Naslain.
Active Sites of Solid Acidic Catalysts; J. Catalysts 57, 64–71 (1979); Amenomiya.
Kinetics of the Low–Pressure Chemical Vapor Deposition of Silicon Carbide; Ceramic Materials & Components for Engines; 443–456; Besmann and Johnson.
On the Chemical Process of CVD of SiC Based Ceramics from the Si–C–H–Cl System; 686–695; Langlais and Prebende.

Primary Examiner—Christopher A. Fiorilla
Attorney, Agent, or Firm—Edward J. Timmer

[57] ABSTRACT

Method/apparatus for making a composite wherein reinforcement or filler material, such as, for example, ceramic fibers or whiskers, are confined in a microwave-transparent envelope, the reinforcement or filler material is microwave heated, and a gaseous reactant stream is flowed through the envelope so as to infiltrate interstices of the heated reinforcement or filler material and chemically vapor deposit a matrix, such as a ceramic matrix, from the interior toward the exterior of the heated material. The envelope imparts a desired shape and size to the composite. After infiltration, the envelope typically is removed from the composite.

6 Claims, 5 Drawing Sheets

METHOD OF MAKING CHEMICAL VAPOR INFILTRATED COMPOSITES

CONTRACTUAL ORIGIN OF THE INVENTION

This invention was made with Government support under Grant No. N00014-90-J-4020 awarded by Office of Naval Research to Northwestern University. The Government has certain rights in the invention.

FIELD OF THE INVENTION

The present invention relates to composites and to a chemical vapor infiltration (CVI) method/apparatus for making same wherein a matrix is formed by microwave-assisted, forced reactant flow chemical vapor infiltration from the interior toward the exterior of reinforcement or filler material, such as ceramic reinforcing fibers, confined in a microwave-transparent envelope that includes an interior shape for imparting a desired configuration to the composite formed therein.

BACKGROUND OF THE INVENTION

Ceramic matrix/ceramic fiber composites having a thin-walled shape, such as a tube, shell, etc., have been fabricated by chemical vapor infiltration (CVI) wherein a fibrous preform is heated isothermally and exposed to a reactive vapor which includes gaseous chemical precursors for the ceramic matrix for long periods of time (e.g. a week or more). During this time, the gaseous chemical precursors infiltrate the fibrous preform and react to deposit the ceramic matrix material on the surfaces of the individual preform fibers and thereby form the matrix of the composite. The rate of the matrix-forming reaction is governed by the temperature of the preform and gaseous reactants, the concentrations of reactants, and the concentration of byproduct gases released by the reaction.

An illustrative reaction for depositing a SiC matrix would involve hydrogen and methyltrichlorosilane (MTS), $CH_3SiCl_3$, as gaseous reactants. At high temperature (e.g. greater than 700° C.), these reactants can deposit SiC on the fiber surfaces with HCl being a byproduct gas that is released by the reaction and that inhibits the deposition of SiC on the fiber surfaces.

In this particular isothermal CVI process, the concentration of MTS is maximum at the preform outer surface and diminishes toward the interior of the preform, while the concentration of the HCl byproduct gas increases towards the interior of the preform. Both of these effects result in preferential deposition of SiC near the outer surface of the fiber preform. Eventually, the surface porosity of the preform is sealed by the deposited SiC, leaving a core region of the preform inadequately infiltrated with the ceramic matrix. One attempt to minimize these adverse effects has involved conducting the CVI process at relatively low temperatures using diluted reactant gases. However, even after very long times (e.g. on the order of 2 months), it has been virtually impossible to make a ceramic/ceramic composite with a cross-section thicker than about 12 mm (millimeters). Even then, the resulting composite microstructure exhibits undesirable porosity.

Another attempt to minimize these adverse affects has involved establishing a temperature gradient across the fiber preform from one side of the preform to the other so that matrix deposition occurs preferentially at the hotter preform side and the cooler preform surface porosity remains open for a longer duration throughout the CVI process. For example, work at Oak Ridge National Laboratory has demonstrated that ceramic matrix/ceramix fiber composites can be made relatively rapidly (e.g. on the order of one day) by maintaining a sharp temperature gradient through the preform to provide a relatively cold side and a relatively hot side while concurrently imposing a flow of gaseous reactants through the preform in the direction of the increasing temperature; i.e. flowing the reactant gases from the cooler preform side to the hotter preform side. By this temperature gradient/forced parallel reactant flow CVI technique, the ceramic matrix is deposited preferentially near the hot side of the preform such that the zone of deposition moves from the hot side toward the colder side as the CVI process is continued. However, this technique is limited to making ceramic/ceramic composites having very simple geometries, such as flat plates and tubes as a result of the need for the temperature gradient across the preform.

It is an object of the invention to provide an improved method/apparatus for making a composite wherein a matrix is microwave-assisted chemical vapor deposited from the interior toward the exterior of reinforcement or filler material confined in a microwave-transparent, shaping envelope in a manner that permits a wide variety of composite sizes (large and small) and configurations (simple and complex) to be made in a relatively rapid time.

It is another object of the invention to provide an improved method/apparatus for making a surface composite on a monolithic body using microwave-assisted chemical vapor deposition from the interior toward the exterior of reinforcement or filler material disposed on the monolithic body.

It is still a further object of the invention to provide a composite wherein the composite includes a matrix chemical vapor deposited from the interior toward the exterior of the reinforcement or filler material of the composite as a result of microwave heating of the reinforcement or filler material during infiltration.

It is still a further object of the invention to provide a composite including relatively thick and thin sections that are microwave-assisted, chemical vapor infiltrated with a matrix material.

It is still another object of the invention to provide a composite wherein the composite is confined in a microwave-transparent envelope that imparts a desired shape to the composite.

SUMMARY OF THE INVENTION

The present invention involves method/apparatus for making a composite wherein reinforcement or filler material, such as, for example, ceramic fibers or whiskers, are confined in a microwave-transparent envelope preferably having an interior configuration corresponding to the composite shape desired, the reinforcement or filler material is microwave heated in the envelope, and a gaseous reactant stream is flowed through the envelope from am inlet to an outlet thereof so as to infiltrate interstices of the heated reinforcement or filler material and chemically vapor deposit a matrix material, such as a ceramic matrix material, from the interior toward the exterior of the heated reinforcement or filler material. After infiltration, the envelope typically is removed from the composite.

The reinforcement or filler material can comprise ceramic, glass, carbon, polymeric or other fibers, filaments, chopped fibers or filaments, whiskers, flakes, and particulates disposed in the envelope. The reinforcement or filler material can be oriented in a particular direction in the envelope or in random manner. The reinforcement or filler material can be preformed by weaving, braiding, lay-up, and other techniques to provide a preshaped body (preform) that is disposed in the envelope for infiltration.

The matrix material can be the same as or different from the reinforcement or filler material.

In one embodiment of the invention, after removal from the envelope, the composite is microwave heated and a gaseous reactant stream is flowed past the heated composite in free flow manner so as to infiltrate an outer, uninfiltrated portion of the composite and chemically vapor deposit a matrix material to complete infiltration of the composite.

In another embodiment of the invention, the gaseous reactant stream is flowed through the envelope in a manner to force the reactant stream through interstices of the heated reinforcement or filler material in a direction generally perpendicular to a temperature gradient established therein by the microwave heating so as to deposit the matrix material.

In still another embodiment of the invention, a microwave susceptor material, such as, for example, carbon, is provided at an interior portion of the reinforcement or filler material so that the susceptor material is initially microwave heated and raises the temperature of the interior portion of the reinforcement or filler material to a high enough temperature for direct coupling thereof with the microwave energy.

In still another embodiment of the invention, the gaseous reactant stream includes precursor materials to generate in-situ at the reinforcement or filler material at least one of the chemical compounds needed to form the matrix material. The chemical compound is catalytically generated by contact of the precursors with the heated material. For example, the reactant stream can include $CO_2$ and $H_2$ that catalytically react in contact with the heated reinforcement or filler material to form water that, in turn, will react with $AlCl_3$ in the reactant stream to form and deposit an $Al_2O_3$ matrix. Generation of the water reactant at the reinforcement or filler material avoids unwanted, premature reaction of the $AlCl_3$ and $H_2O$ and deposition of the resultant $Al_2O_3$ at unwanted regions of the CVI apparatus.

In still a further embodiment of the invention, a surface composite is formed on a monolithic body by disposing reinforcement or filler material on the monolithic body in an optional microwave-transparent envelope, microwave heating the reinforcement or filler material, and flowing a gaseous reactant stream in contact with the material so as to chemically vapor deposit a matrix material from the interior toward the exterior thereof and thereby form a surface composite on the underlying monolithic body.

The present invention also involves a composite comprising a matrix and reinforcement or filler material in the matrix wherein the matrix is chemical vapor infiltrated from the interior toward the exterior of reinforcement or filler material. The composite can have a simple or complex configuration with relatively thick and thin sections and be small or large in size as determined by the interior configuration of the shaping envelope.

The present invention also provides an article of manufacture, comprising a monolithic body having a composite formed in-situ on a surface thereof wherein the composite comprises reinforcement or filler material chemical vapor infiltrated from the interior toward the exterior thereof with a matrix material.

The aforementioned objects and advantages of the invention will become more readily apparent from the following detailed description taken with the following drawings.

DETAILED DESCRIPTION

Figure 1:
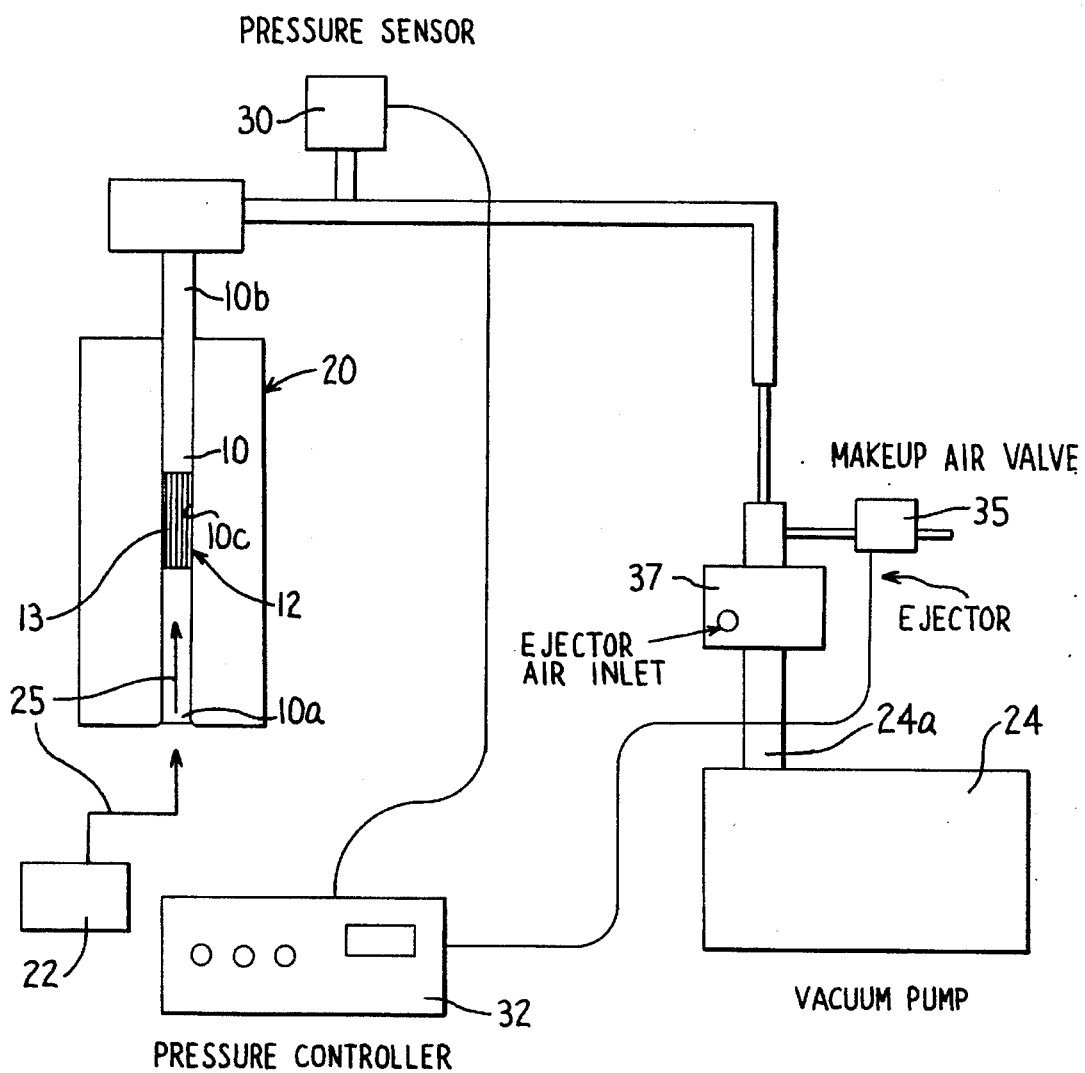
FIG. 1 is a schematic view of microwave-assisted, forced reactant flow CVI apparatus in accordance with one embodiment of the invention for chemical vapor infiltrating ceramic or other reinforcement or filler material in accordance with a method embodiment of the invention.

Referring to FIG. 1, apparatus in accordance with one embodiment of the invention is schematically illustrated. Although the apparatus is illustrated and discribed herebelow with respect to making a ceramic/ceramic composite, the invention is not so limited. For example, the present invention also can be practiced to make composites where the reinforcement or filler material and the matrix material comprise glass (e.g. glass/glass composites), carbon (e.g. carbon/carbon composites) and other non-metallic materials such as possibly polymeric materials, as well as various combinations thereof to make composites such as glass/ceramic composites, carbon/glass composites, carbon/ceramic composites, etc. wherein the materials set forth can comprise the reinforcement or filler material 12 or the matrix material.

The apparatus is illustrated as including microwave transparent tubular envelope 10 for confining ceramic or other reinforcement or filler material 12 therein. The envelope 10 can be oriented vertically as shown, horizontally or at other orientations. The reinforcement or filler material 12 can comprise fibers, filaments, chopped fibers and filaments, whiskers, flakes, particles, and other reinforcement or filler shapes disposed in the envelope 10. The reinforcement material can be used to enhance the mechanical properties of the composite in one or more directions thereof. Reinforcement materials such as fibers can be used uncoated or coated with a debond layer to provide improved composite properties. Alternately, the filler material can be used merely to reduce the amount of CVI matrix needed to form the composite body.

For example, as illustrated in FIG. 1, the reinforcement material 12 can comprise ceramic or other fibers 13 oriented in a particular direction to impart anisotropic mechanical properties to the ceramic/ceramic or other composite formed. Alternately, the reinforcement material 12 also can comprise randomly oriented, loose ceramic or other whiskers (not shown) that can impart improved generally isotropic mechanical properties to the composite formed.

The reinforcement or filler material 12 can be preformed by conventional two or three dimensional weaving, two or three dimensional braiding, ply lay-up or stacking, felt-making techniques as well as other techniques to provide a preshaped body (preform) that can be disposed in the envelope 10 for chemical vapor infiltration of the pores or interstices of the material 12 to form the matrix therein.

Ceramic reinforcement or filler material can comprise a wide variety of ceramic materials including for purposes of illustration, not limitation, alumina, mullite, aluminoborosilicate, silicon carbide, NICALON SiC-like material in the form of fibers, filaments, chopped fibers or filaments, whiskers, flakes, particles, and the like which can be randomly oriented, aligned in one or more directions, or preformed by weaving, braiding and the like as described hereabove. Similar forms of glass, carbon, polymeric, and other reinforcement or filler materials can be used for making composites other than ceramic/ceramic composites, for example, as discussed hereabove (e.g. glass/glass composites, carbon/carbon composites, glass/ceramic composites, etc.).

In effect, the tubular envelope 10 acts as a container or mold in which the reinforcement or filler material 12 is confined in a desired configuration and size while the matrix is formed in-situ by CVI. The envelope 10 includes an inlet 10a and outlet 10b for flow of the gaseous reactant stream 25 employed in the CVI process. The envelope 10 is made from a material that is substantially impervious to the gaseous reactant stream 25 and that is substantially non-reactive with the reinforcement or filler material 12. For example, the envelope 10 can be made of microwave-transparent quartz glass, high silica glass, borsilicate glass, or possibly a ceramic material such as mullite or other low dielectric loss ceramic material. By "microwave-transparent" is meant a low electrical conductivity, low dielectric loss material through which microwaves can readily pass to heat the contents of the envelope 10.

The envelope 10 includes an interior wall 10c that is configured to define a shaping cavity or chamber for confining the porous reinforcement or filler material 12 in the desired shaped and sized mass for infiltration of interstices of the material 12 with the matrix. The envelope 10 can be formed to desired interior shape and size by conventional glass or ceramic forming techniques. Ceramic/ceramic and other composites having a simple shape or a complex shape including relatively thick and thin sections can be made using the appropriately configured envelope 10. For example, referring to FIG. 4, fiber material 12' having relatively thick and thin sections T1 and T2 is shown for purposes of illustration, not limitation, in an envelope 10' having a complementary interior configuration to form thick and thin composite sections.

The ceramic and other reinforcement or filler material 12 typically is positioned in the envelope cavity prior to placement of the envelope 10 in the microwave heating device 20. Loose, randomly oriented reinforcement or filler material 12 can be simply poured or otherwise introduced into the envelope cavity 10d until the cavity is filled and retained therein by suitable means. Alternately, reinforcement or filler material 12 in the form of fibers can be wedged or engaged in the envelope 10 as set forth in the examples hereafter. Ceramic or other reinforcement or filler material 12 in the form of a preformed porous body or component can be inserted in the cavity through the inlet or outlet 10a, 10b or through a suitable envelope opening (not shown) that can be subsequently suitably sealed. The preform can be supported in appropriate position in the envelope cavity by engagement of the preform with the interior envelope wall or by one or 10 more microwave-transparent positioning filament(s) (not shown) for suspending the preform therein, one or more microwave-transparent supports (not shown), or other positioning means.

To effect CVI of the matrix, the envelope 10 is located in a conventional single mode or multi-mode microwave heating device or oven 20 in order to heat the ceramic reinforcement or filler material 12 to an appropriate temperature to deposit the ceramic or other matrix material on the reinforcement or filler material 12 in the envelope. Microwave heating of the reinforcement or filler material 12 results in temperature gradients within the material 12 with the interior of the material 12 being at a higher temperature than the exterior surface region of the material 12. The decreasing temperature gradient from the interior toward the exterior of the material 12 occurs as a result of the microwave energy being converted to heat throughout the volume of the material 12 while heat is dissipated from the exterior surface of the material 12. Microwave heating thereby can provide temperature gradients such that the rate of deposition of the matrix material (which is temperature dependent) is higher at the interior of the material 12 than at the exterior. In FIG. 1, the temperature gradient extends in an outward direction through the material 12 as a result of the cylindrical shape of the material 12. Microwave heating of the material 12 in accordance with the invention thus takes advantage of the temperature dependence of the deposition rate of matrix material to provide interior-to-exterior infiltration of interstices of the the material 12 with ceramic matrix material while the material 12 is confined to a particular desired shape by the envelope 10.

These matrix deposition kinetics overcome the aforementioned adverse concentration effects observed heretofore in isothermal CVI processes. Thus, it is possible in accordance with the invention to form the composite by depositing the matrix material preferentially from the interior and building the deposit through interstices of the reinforcement or filler material 12 toward the exterior thereof. This interior-to-exterior matrix deposition not only enables much thicker composites to be formed but also enables achievement of much higher deposition rates since the invention is not limited to the lower temperatures and dilute reactants used in practicing the aforementioned isothermal CVI process. This interior-to-exterior matrix deposition can produce lower final composite porosity than that produced by the isothermal CVI process.

A single mode microwave heating oven (model CMPR 250) available from Wavemat Corp., 4419 Plymouth Oaks Blvd., Plymouth, Mich. 48170, was used in the examples set forth herebelow, although the invention is not limited to any particular microwave heating oven. Multi-mode microwave heating ovens can be used for commercial production of ceramic/ceramic composites having large sizes and complex shapes. Smaller, more simply configured composites may be better produced in single mode microwave ovens.

A susceptor material, such as carbon, can be provided at the interior of the reinforcement or filler material 12 in order to facilitate microwave heating to the desired CVI temperature, especially when the material 12 (such as $Al_2O_3$ fibers) exhibits a low electrical conductivity and/or low dielectric loss. The susceptor material at the interior of the material 12 is initially heated by the microwave energy and quickly raises the temperature of the proximate material 12 to a level where the material 12 will couple with the microwave energy for continued heating to the CVI 10 temperature. The susceptor material can be introduced at the interior of the reinforcement or filler material 12 before or after the material is placed in the envelope 10, or the susceptor material can be incorporated on fibers, fabric, and the like constituting the material 12. One technique for providing susceptor material at the interior of the material 12 in accordance with the invention is described in example 1 set forth herebelow. The envelope 10 is positioned in the microwave heating device 20 with the inlet 10a communicated to a source or supply 22 (shown schematically) of gaseous reactants to provide a gaseous reactant stream 25 through the envelope 10 and with the outlet 10b communicated to a suitable pump 24 (schematically shown) for establishing a desired forced reactant stream flow rate through the envelope 10 sufficient to infiltrate interstices of the microwave heated material 12 and chemically vapor deposit a ceramic or other matrix material from the interior toward the exterior of the heated material 12 as a result of the microwave heating effect.

The ceramic or other matrix material can have the same composition as the reinforcement or filler material 12 or a different composition depending on the composite properties required for a given service application.

FIG. 1 illustrates a preferred apparatus of the invention wherein the gaseous reactant stream 25 is flowed through the envelope 10 in a manner to force the gaseous reactant stream through interstices of the heated reinforcement or filler material 12 in a direction generally perpendicular to the outward temperature gradient established therein by the microwave heating.

The supply 22 for the gaseous reactant stream 25 can comprise a conventional generator used heretofore in CVI manufacture of ceramic/ceramic composites to provide a reactant stream that will deposit a ceramic matrix on the material 12. For example, in depositing alumina ($Al_2O_3$) matrix material on alpha alumina fibers as described in Example 1, the supply 22 can comprise a conventional $AlCl_3$ generator wherein chlorine gas is passed over a bed of Al pellets at an elevated temperature suitable to form $AlCl_3$ gaseous reactant. The $AlCl_3$ gaseous reactant reacts with water proximate the heated alumina fiber material 12 in the envelope 10 to form $Al_2O_3$ which is deposited onto the fiber material 12.

In practicing the present invention to deposit $Al_2O_3$ matrix material, the water reactant preferably is catalytically generated by providing $CO_2$ and $H_2$ along with $AlCl_3$ in the reactant stream 25 and catalytically reacting the $CO_2$ and $H_2$ by contact of the reactant stream with the heated material 12 in the envelope 10. Water vapor thereby is generated at the interior of the reinforcement or filler material 12 for immediate reaction with the $AlCl_3$ to form and directly deposit $Al_2O_3$ matrix material on the material 12. Formation of the water reactant in this manner avoids homogenous nucleation of $Al_2O_3$ particles that might otherwise occur if water vapor is present in the bulk reactant stream flowing into the envelope 10.

The composition of the matrix precursors of the gaseous reactant stream flowed through the envelope 10 will be selected in dependence on the ceramic or other matrix material to be deposited on the reinforcement or filler material 12. For purposes of further illustration but not limitation, example 1 sets forth a gas reactant stream composition for CVI'ing an $Al_2O_3$ matrix about alpha alumina fibers and example 2 sets forth a gaseous reactant stream composition for CVI'ing a silicon carbide matrix about NICALON silicon carbide-like fibers. Other reactant stream precursors can be selected as appropriate for depositing ceramic matrices of other compositions as those skilled in the art will appreciate.

In practicing the invention, the reinforcement or filler material 12 residing in the envelope 10 is first microwave heated by the microwave heating device 20 to an appropriate temperature for CVI of the matrix material. After the desired temperature is reached, the gaseous reactant stream is flowed through the envelope 10 in a manner to be forced to infiltrate interstices of the heated material 12 and deposit the matrix material therein. As mentioned hereabove, the gaseous reactant stream is flowed through the envelope 10 in a manner to force the gaseous reactant stream through interstices of the heated material 12 in a direction generally perpendicular to the radial temperature gradient established therein by the microwave heating.

The respective flow rates of the gaseous reactants comprising stream 25 are controlled by respective conventional mass flow controllers (not shown). The reaction byproduct gas pressure downstream of the material 12 is controlled by the vacuum pump 24 and a pressure control system in response to the pressure controller. The flow rate of the gaseous reactant stream through interstices of the material 12 is controlled by the differential pressure established across the material 12 in the envelope 10.

One pressure control system for use in the invention comprises a pressure sensor 30 and pressure controller 32 (e.g. MKS Model 250 pressure controller available from MKS Instrument, Inc.) that controls introduction of make-up air to the vacuum pump conduit 24a via make-up air valve 35 (e.g. MKS Model 248 feed back valve) and air ejector 37 located upstream of an oversized vacuum pump 24, FIG. 1.

Alternately, the downstream byproduct gas pressure can be controlled using pressure sensor 30 and pressure controller 32 to directly control a vacuum pump 24 that is sized appropriately for the pressures involved; i.e. a pump that is not oversized.

The ceramic or other matrix material is deposited in dependence on the temperature gradient established by the microwave heating such that matrix deposition occurs from the interior toward the exterior of the shaped material 12. The shape of the deposited matrix material will correspond to the shape of the material 12 as confined and determined by the interior configuration of the envelope 10. As deposition takes place from the interior toward the exterior of the material 12, the entire shape of the material 12 can be infiltrated with matrix material with the exception of a relatively thin outermost surface region or zone z disposed about the matrix inflitrated core K, FIG. 3. For example, a thin outermost zone remains uninfiltrated or open to reactant flow in order for the reactant stream to infiltrate the material 12 and for the byproduct gases (e.g. HCl when $AlCl_3$ and water react to form $Al_2O_3$) to be exhausted to the outlet 10b. When the material 12 comprises ceramic or other fibers, the outermost, uninfiltrated zone may have a width of a few fiber diameters or more.

The microwave-assisted deposition of the matrix material allows virtually any shape and size of composite to be made in accordance with the invention. Thus, reinforcement or filler material 12 in complex shape having relatively thick and thin sections (see FIG. 4) can be infiltrated with matrix material. Microwave heating insures that the thicker sections of the material 12 will be heated to the highest temperature where infiltration will be initiated and progress toward the exterior of the section(s).

After the reinforcement or filler material 12 is infiltrated with the ceramic matrix with the exception of the outermost, uninfiltrated zone, the composite is removed from the microwave heating device 20, and the envelope is removed from the composite. The envelope 10 can be removed by grinding, sandblasting, or other suitable means.

Figure 2:
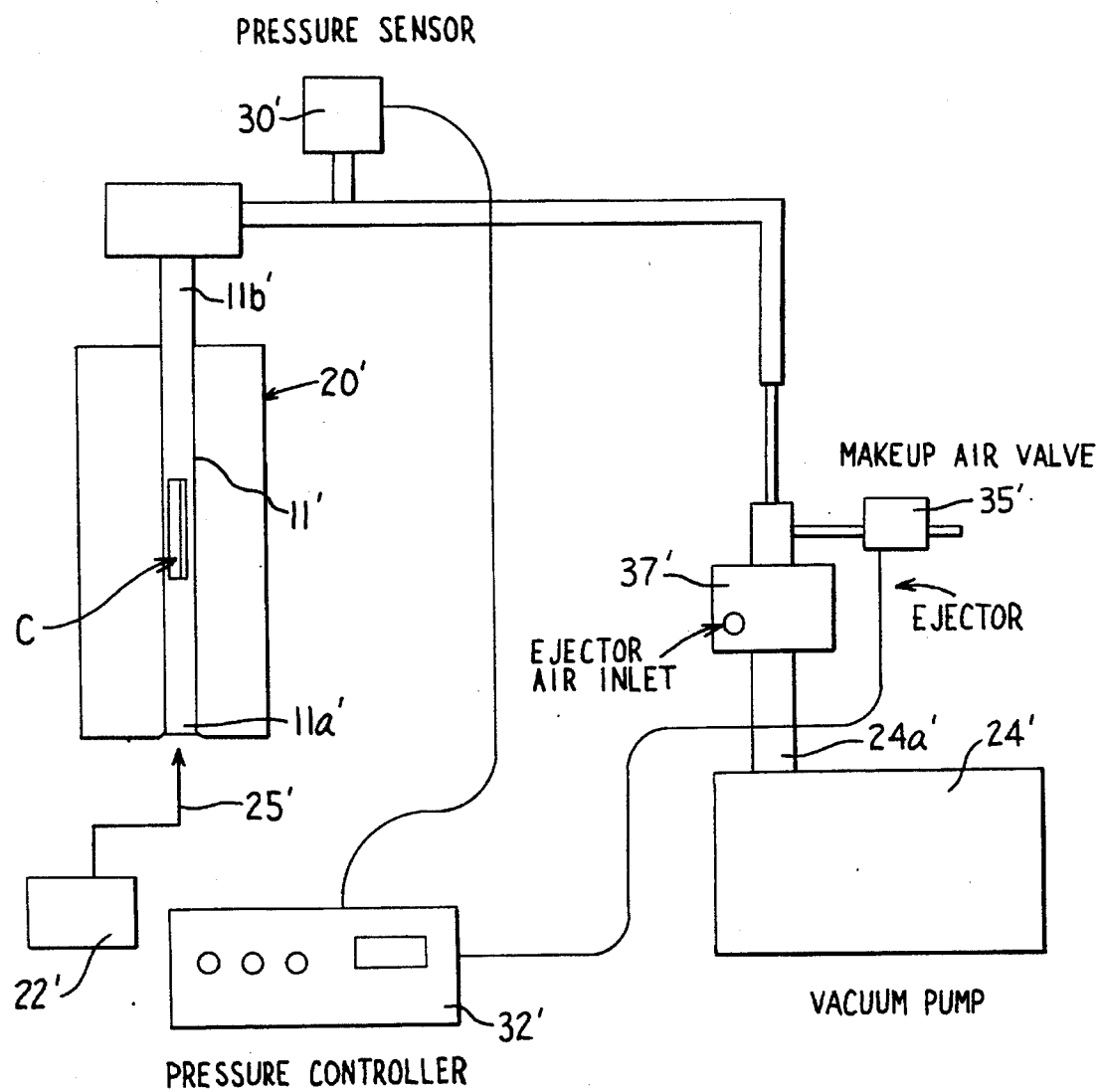
FIG. 2 is a schematic view of microwave-assisted, free reactant flow CVI apparatus in accordance with another embodiment of the invention for chemical vapor infiltrating ceramic or other reinforcement or filler material in accordance with another method embodiment of the invention.
Figures 3, 4:
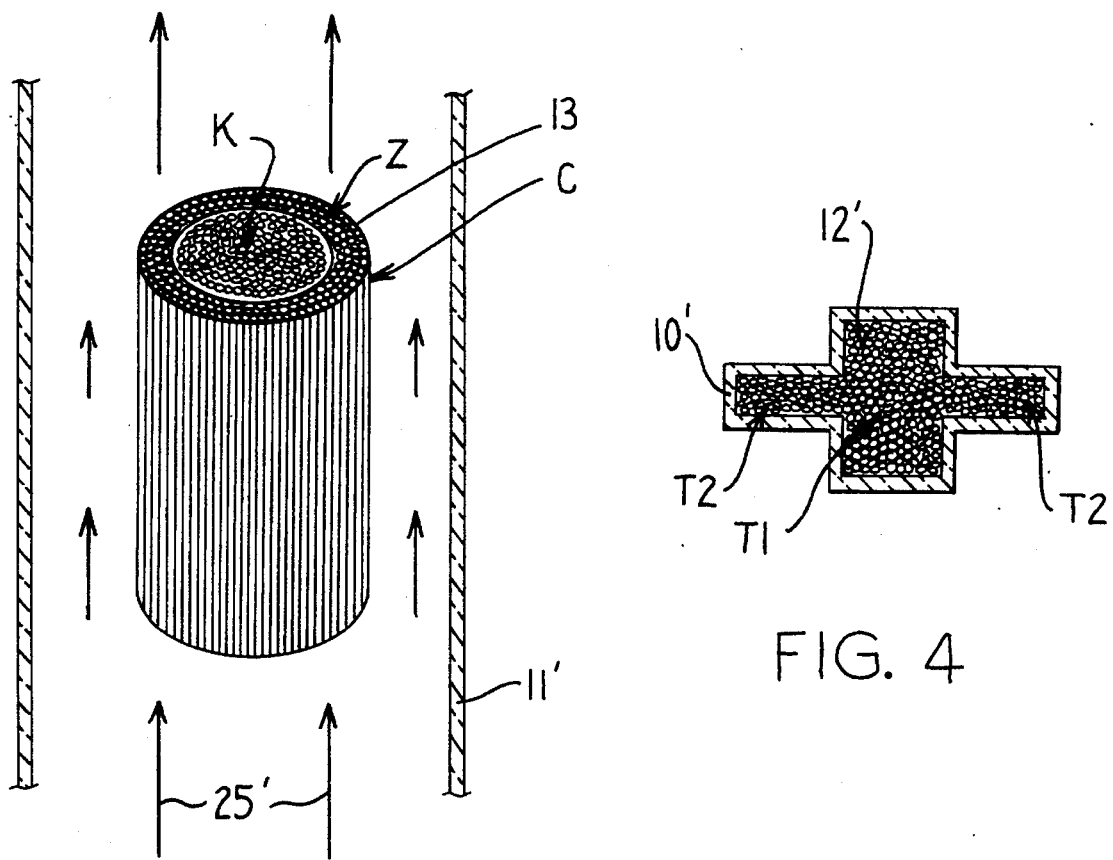
FIG. 3 is an enlarged schematic view of the reaction vessel of FIG. 2.
FIG. 4 is a cross-sectional view of a shaping envelope in accordance with still another embodiment of the invention for chemical vapor infiltrating ceramic or other reinforcement or filler material having relatively thick and thin sections.

After the envelope 10 is removed, the outermost, uninfiltrated zone of the composite is infiltrated using the apparatus schematically illustrated in FIGS. 2–3 wherein like features of FIG. 1 are designated using like reference numerals primed. The apparatus of FIG. 2–3 differs from the apparatus of FIG. 1 in flowing the gaseous reactant stream 25' past the outer surface of the microwave heated composite C in free flow manner in a reaction vessel 11' so that interstices of the outermost, uninfiltrated zone Z are infiltrated with the reactant stream 25' and the ceramic or other matrix is chemically vapor deposited throughout the outermost zone Z to provide complete infiltration of the composite C. The envelope 10 of FIG. 1 directly confining the material 12 to a particular size/shape is not needed or used in the apparatus of FIGS. 2–3. Instead, the composite C is placed in a simple reaction vessel 11' through which the gaseous reactant stream 25' is flowed past the outer composite surface as shown in FIGS. 2–3. The composite C can be suspended in position in the vessel 11' by one or more microwave-transparent filaments, by one or more microwave-transparent supports or other suitable means. Thus, the finishing of the composite C is achieved by removing the envelope 10 of FIG. 1 and infiltrating interstices of the outermost zone Z thereof in the apparatus of FIGS. 2–3.

Figure 5:
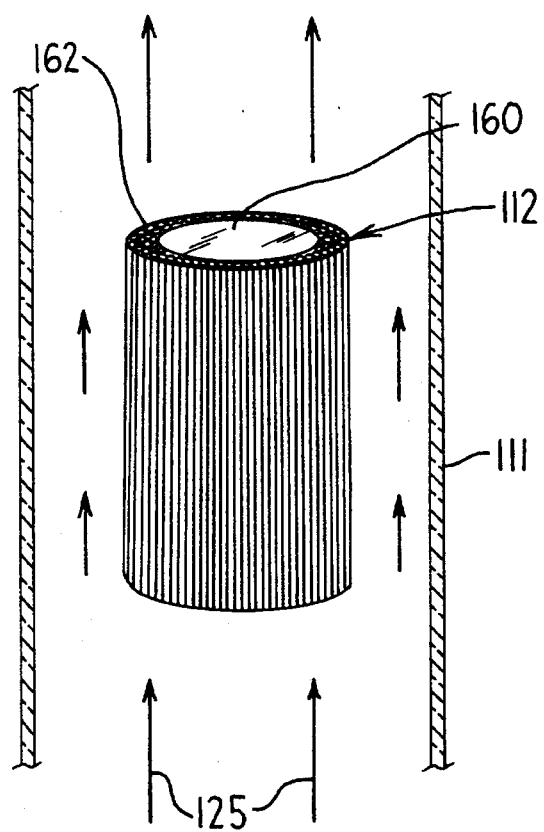
FIG. 5 is a schematic view of microwave-assisted, forced reactant flow CVI apparatus in accordance with still another embodiment of the invention for forming a ceramic/ceramic or other composite shell on a mandrel in accordance with the invention.

The present invention can be used to produce bulk ceramic/ceramic or other composites of various shapes and sizes as determined by the interior configuration of the envelope 10. Moreover, the present invention can be used to make a ceramic/ceramic or other composite shell by disposing the reinforcement or filler material 112 on a suitable mandrel 160 heatable by microwave energy, FIG. 5, in a CVI reaction vessel 111. The material 112 optionally can be confined on the mandrel by a microwave-transparent envelope (not shown), such as silica glass, through which the gaseous reactant stream 125 can be flowed. The material 112 can be infiltrated with ceramic or other matrix material from the interior toward the exterior by microwave heating in the manner described hereabove with respect to FIG. 1 (if an envelope 10 is used) or FIGS. 5 (if no envelope 10 is used) with concurrent flow of the gaseous reactant stream 125 through interstices of the material 112. The mandrel and optional envelope then are removed from the composite shell to free it for final finishing of the outermost, uninfiltrated surface zone in the manner described hereabove.

Figure 6:
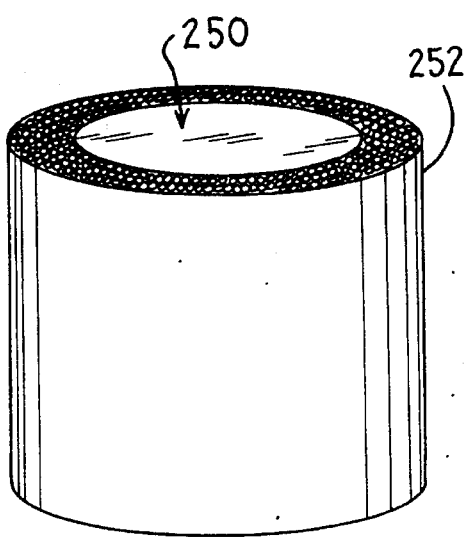
FIG. 6 is a sectional view of a monolithic ceramic body having a surface ceramic/ceramic or other composite layer formed and bonded thereon in accordance with the invention.

The present invention also can be used to form a surface composite on a monolithic body, such as a monolithic ceramic body. For example, there are many potential service applications of ceramic materials where adequate toughness could be provided by a surface composite layer applied over a monolithic body of the same or different ceramic material, since the strength-limiting cracks in many ceramic articles originate at the surface. If the article surface could be rendered sufficiently tough, it would not be necessary for the entire article to have enhanced toughness to resist surface crack propagation. Thus, an article of manufacture fabricated with a core or body 250 comprising a monolithic ceramic and relatively thin layer 252 of ceramic/ceramic or other composite bonded to the surface, FIG. 6, would be advantageous. Such an article can be made in the manner described hereabove for making a ceramic/ceramic composite or other shell wherein the mandrel 160 is replaced by the monolithic ceramic or other body 250. The preferential heating attributable to the microwave energy causes the matrix material to be deposited from the outer surface of the monolithic body outward through the surface reinforcement or filler material. The envelope, if used, then is removed from the composite covered monolithic body shell to free it for final finishing of the outermost, uninfiltrated surface zone in the manner described hereabove with respect to FIGS. 2–3. A monolithic ceramic body having a crack resistant ceramic/ceramic or other composite surface layer bonded thereon is made.

The embodiments described hereabove involve using microwave heating of the reinforcement or filler material as confined in a desired shape and size by the microwave-transparent envelope 10 to provide matrix deposition from the interior toward the exterior of the material. The resulting composite structures, whether bulk composites, shells, or surface layers, will be significantly more dense, stronger, and tougher than like composite structures produced by the aforementioned isothermal CVI process.

The following examples are offered for purposes of illustrating the invention in greater detail, but not to limit the invention.

Example 1

Alumina fiber/alumina matrix composites were individually formed by positioning a respective fiber preform comprising alumina fiber tows having a collective diameter of 16 mm in a respective silca glass tube (constituting the envelope 10 of FIG. 1) having an inner diameter of 16 mm. Each preform comprised numerous tows of alumina fibers oriented parallel to one another along the same axis. Tows comprising 200 alumina filaments (filament diameter of 20 microns) or 1000 alumina filaments (filament diameter of 10 microns) were used in this example.

Before placement of each preform in the silica glass tube, an interior portion of the preform was impregnated with a sugar solution, dried in an oven, and pyrolyzed by heating in a separate furnace in the absence of oxygen to provide a carbon-containing limited interior zone in the fiber preform. The carbon functioned as a susceptor material at the interior of the preform during heating in a microwave oven.

Each preform was microwave heated in a single mode Wavemat oven operated at 2.45 gegahertz (HGz) using apparatus similar to that of FIG. 1. Initial heating of the carbon susceptor material caused a rapid increase in the temperature of the alpha alumina preform fibers to the point that they coupled directly with the microwave energy for continued heating. The carbon was thermodynamically unstable under the matrix deposition conditions and thus was removed early in the matrix deposition process.

Figure 7:
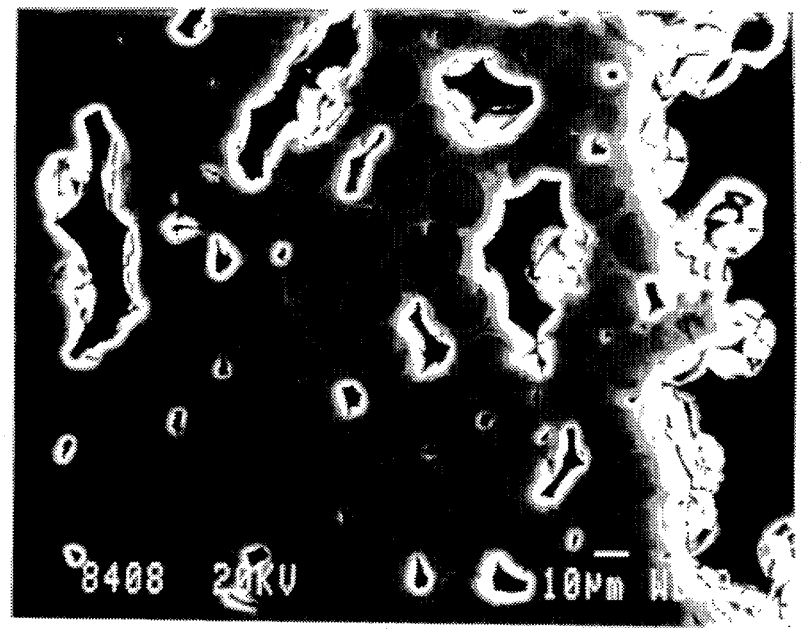
FIG. 7 is a photomicrograph of a ceramic/ceramic composite made in accordance with example 1 of the invention.

Each preform was heated to a surface temperature between 500–1000 degrees C. by the aforementioned Wavemat microwave prior to introduction of the gaseous reactant stream 25 to the silica glass envelope. The reactant stream comprised 6 vol. % $AlCl_3$ vapor, 28 vol. % $CO_2$, 28 vol. % $H_2$, and 38 vol. % $N_2$ as a carrier gas for depositing $Al_{22}O_3$ matrix material. A partial vacuum of from 20–50 torr was maintained on the downstream side of the preform and a reactant gas stream pressure of from 80 to 610 torr was maintained on the upstream side of the preform for 8–14 hours. Deposition of alumina matrix material was observed to occur from the interior of the preform toward the exterior as determined by the microwave induced temperature gradient to produce a cylindrical composite shape corresponding to the inner diameter of the silica glass tube used as the envelope 10. The deposited alumina in the preform represented from 50% to 100% of the theoretical maximum amount based on the amount of $AlCl_3$ supplied to the preform. FIG. 7 is an SEM (scanning electron microscope) photomicrograph of a ceramic/ceramic composite formed pursuant to this example showing an alumina matrix and alumina fibers.

Example 2

Silicon carbide fiber/silicon carbide matrix composites were individually formed by helically winding 1000 fiber tows of Nicalon silicon carbide-type fibers (fiber diameter of 10–15 micrometers) on a 6.4 mm diameter SiC rod to form a preform. The total outer diameter of the wound rod was 8–12 mm. Each preform was suspended in a respective silica glass tube constituting the reaction vessel 11 of FIG. 2). Silica tubes having an inside diameter of 16 mm or 40 mm were used.

Figure 8:
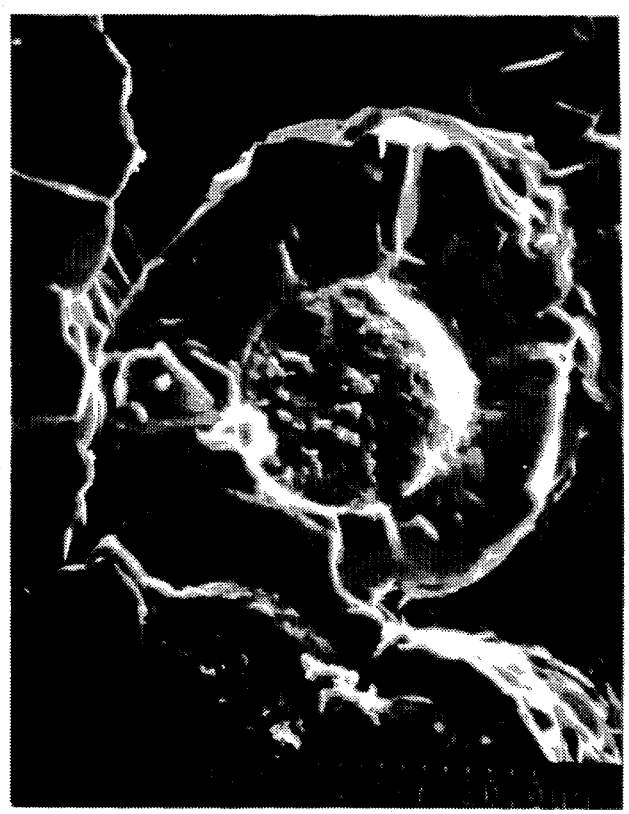
FIG. 8 is a photomicrograph of a ceramic/ceramic surface composite made in accordance with example 2 of the invention.

Each preform was microwave heated in a single mode Wavemat oven operated at 2.45 gegahertz to provide a preform surface temperature of 750 to 1000 degrees C prior to introduction of the gaseous reactant stream to the silica glass vessel. The reactant stream comprised methyltrichlorosilane (MTS) in hydrogen diluted with nitrogen. The $H_2$:MTS ratio used was 10:1 or 5:10, the $N_2$ was from 15 to 25 vol.%, and the reactant gas stream pressure in the vessel 11 was maintained between 40–120 torr. Deposition of the silicon carbide matrix material was conducted for 8–24 hours. Relatively high density SiC/SiC surface composites with residual porosity of less than 10% were produced by this example on the SiC rod. FIG. 8 is SEM photomicrograph of a ceramic/ceramic surface composite formed pursuant to this example.

While the invention has been described in terms of specific embodiments thereof, it is not intended to be limited thereto but rather only to the extent set forth in the claims which follow.

The embodiments of the invention in which an exclusive property or privilege is claimed are defined as follows:

1. A method of making a composite, comprising confining reinforcement or filler material in a microwave-transparent envelope, microwave heating said material in said envelope, flowing a gaseous reactant stream through said envelope so as to chemically vapor deposit a matrix material from an interior toward an exterior of said heated reinforcement or filler material to form said composite, removing said envelope from said composite, microwave heating said composite after removal from said envelope, and flowing a gaseous reactant stream past the heated composite so as to infiltrate an outer uninfiltrated portion of said composite and chemically vapor deposit a matrix in the outer uninfiltrated portion.

2. A method of making a composite, comprising confining reinforcement or filler material in a microwave-transparent envelope having an interior configuration corresponding to composite shape to be made, microwave heating said material to establish a decreasing temperature from an interior toward an exterior of said material, flowing a gaseous reactant stream through said envelope so as to chemically vapor deposit a matrix from the interior toward the exterior of said heated material to form said composite so that said interior configuration of said envelope is imparted to said composite, and removing said composite from said envelope.

3. A method of making a ceramic/ceramic composite, comprising confining ceramic reinforcement or filler material in a microwave-transparent envelope having an interior configuration corresponding to a composite shape to be made so as to cause a gaseous reactant stream flowing through said envelope to flow through interstices of said material, microwave heating said material to establish a decreasing temperature gradient from an interior toward an exterior of said material, flowing the gaseous reactant stream through said envelope in a direction generally perpendicular to the temperature gradient so as to chemically vapor deposit a ceramic matrix from the interior toward the exterior of said heated material to form said composite having imparted thereto said interior configuration of said envelope, and removing said composite from said envelope.

4. A method of making a surface composite on a monolithic body, comprising disposing reinforcement or filler material on said monolithic body, microwave heating said material, flowing a gaseous reactant stream in contact with said heated material so as to chemically vapor deposit a matrix material from an interior toward an exterior of said heated material and thereby form a surface composite on said monolithic body.

5. The method of claim 4 wherein said material is disposed on a monolithic ceramic body.

6. A method of making a composite, comprising confining reinforcement or filler material in a microwave-transparent envelope, microwave heating said material in said envelope, flowing a gaseous reactant stream through said envelope so as to chemically vapor deposit a matrix material from an interior toward an exterior of said material to form a composite with an outer uninfiltrated portion, separating said composite and said envelope, microwave heating said composite after separation from said envelope, and flowing a gaseous reactant stream past said heated composite so as to infiltrate the outer uninfiltrated portion of said composite and chemically vapor deposit a matrix material in said outer uninfiltrated portion.

* * * * *